United States Patent
Vovos et al.

(10) Patent No.: US 11,394,340 B2
(45) Date of Patent: Jul. 19, 2022

(54) AC DRIVE DV/DT FILTER USING REVERSE RECOVERY CHARGE OF DIODES

(71) Applicant: BAE Systems Controls Inc., Endicott, NY (US)

(72) Inventors: Robert J. Vovos, Vestal, NY (US); Peter A. Carruthers, Ithaca, NY (US); Benjamin T. Webster, Lisle, NY (US)

(73) Assignee: BAE Systems Controls Inc., Endicott, NY (US)

( * ) Notice: Subject to any disclaimer, the term of this patent is extended or adjusted under 35 U.S.C. 154(b) by 76 days.

(21) Appl. No.: 16/861,887

(22) Filed: Apr. 29, 2020

(65) Prior Publication Data
US 2021/0344297 A1 Nov. 4, 2021

(51) Int. Cl.
*H02P 27/08* (2006.01)
*H02P 29/50* (2016.01)
*H03H 7/01* (2006.01)
*H02J 3/01* (2006.01)
*H02M 1/12* (2006.01)

(52) U.S. Cl.
CPC .............. *H02P 29/50* (2016.02); *H02J 3/01* (2013.01); *H02M 1/126* (2013.01); *H02P 27/08* (2013.01); *H03H 7/0138* (2013.01)

(58) Field of Classification Search
CPC . H02P 29/50; H02P 27/08; H02J 3/01; H02M 1/26; H03H 7/0138
See application file for complete search history.

(56) References Cited

U.S. PATENT DOCUMENTS

| | | | | |
|---|---|---|---|---|
| 5,886,880 A | * | 3/1999 | Hisanaga | H02M 3/33561 363/20 |
| 6,028,418 A | * | 2/2000 | Jovanovic | H02M 3/158 323/222 |
| 6,069,472 A | * | 5/2000 | Pernyeszi | H02M 3/155 323/282 |
| 6,377,481 B1 | * | 4/2002 | Mantov | H02M 1/34 363/56.12 |

(Continued)

OTHER PUBLICATIONS

Acharya, B. et al., "Design of Output dv/dt Filter for Motor Drives", 5th International Conference on Industrial and Information Systems, 2010, pp. 562-567.

(Continued)

*Primary Examiner* — Rina I Duda
(74) *Attorney, Agent, or Firm* — Scully Scott Murphy & Presser PC; Scott J. Asmus (57) ABSTRACT

Passive filters, line replaceable units and a modular power supply are provided. The passive filter comprises an inductor and a diode bridge. The inductor has a first end and a second end. The first end is coupleable to a phase output of an inverter. The diode bridge comprises a first diode and a second diode. The anode of the first diode is coupled to the second end of the inductor and a cathode of the first diode is coupleable to a positive DC bus voltage. The cathode of the second diode is coupled to the second end of the inductor and the anode of the second diode is coupleable to a negative DC bus voltage. The passive filter output is coupleable to cable(s) for an AC electric machine. A reverse recovery charge of the diodes achieves a target DV/DT for an output voltage of the passive filter at operating temperatures.

9 Claims, 7 Drawing Sheets

(56) References Cited

U.S. PATENT DOCUMENTS

| | | | |
|---|---|---|---|
| 8,218,344 B2 * | 7/2012 | Mueller | H02M 7/5388 363/71 |
| 9,318,992 B2 * | 4/2016 | Swamy | H02P 29/024 |
| 2004/0130923 A1 | 7/2004 | Ho et al. | |
| 2005/0035729 A1 | 2/2005 | Lev et al. | |
| 2008/0205104 A1 | 8/2008 | Lev et al. | |
| 2013/0235626 A1 | 9/2013 | Jang et al. | |
| 2017/0257022 A1 | 9/2017 | Bryant | |

OTHER PUBLICATIONS

Habetler, T. et al., "Design and Implementation of an Inverter Output LC Filter Used for DV/DT Reduction", IEEE Transactions on Power Electronics, May 2002, pp. 327-331, vol. 17, No. 3.
Stealth Diode ISL9R18120S3S, Mar. 2020, pp. 1-9, Rev. 3.
Semiconductor Components Industries, LLC, "Stealth Diode 18A, 1200V, ISL9R18120G2, ISL9R18120S3S", Publication Order No. ISL9R18120S3S/D, Mar. 2020, Rev. 3, p. 1-3 [online] <URL: https://www.onsemi.com/pdf/datasheeUisl9r18120s3s-d.pdf>.
International Search Report, PCT/US21/29279, dated Aug. 12, 2021, 17 pages.

* cited by examiner

AC DRIVE DV/DT FILTER USING REVERSE RECOVERY CHARGE OF DIODES

FIELD OF THE DISCLOSURE

This disclosure relates to passive filters for power supplies for AC motors. This disclosure also relates to modular power supplies with passive filters.

BACKGROUND

AC motors are typically supplied with AC power using power supplies having inverters. The inverters contain multiple switches. The switches may be MOSFETs or IGBT switches. These switches are controlled via pulse width modulation (PWM). The switching frequency of these switches may be high resulting in a high dv/dt. High dv/dt may cause problems in the AC motor. For example, a high dv/dt may cause a voltage doubling. This doubling may lead to motor insulation failure depending on the specific AC motor. Additionally, the voltage doubling may cause ground currents that may result in electromagnetic interference.

Additionally, the length of cabling between the power supply and the AC motor may impact the effect. For example, a longer cable may reduce the dv/dt but may increase voltage doubling due to voltage reflections on the cable. This is due to the cables resistance, inductance and capacitance.

Certain standards provide requirements for peak voltage output and dv/dt.

Figure 1:
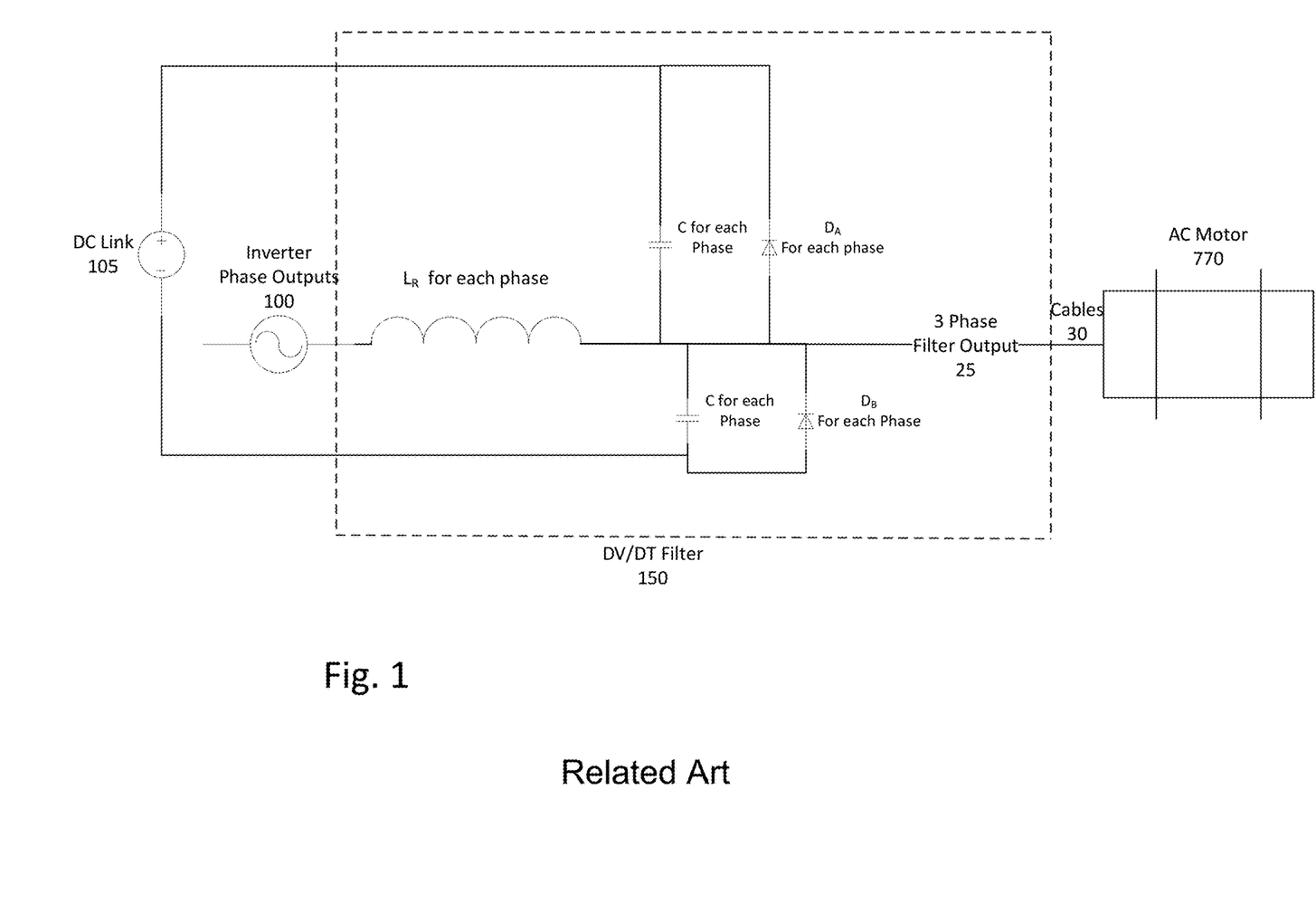
FIG. 1 illustrates an example of a known LC dv/dt filter for an AC motor.

In order to reduce the dv/dt seen at an AC motor 770, active or passive filters may be used. One known passive dv/dt filter 150, which may be used for a three-phase inverter, is an LC filter with clamping diodes $D_A$ and $D_B$ as shown in FIG. 1. The inverter (not shown) is supplied power by a DC link 105. The passive dv/dt filter 150 includes an inductor $L_R$ coupled to the output of the inverter 100 (for each phase) and capacitors C (two per phase). The AC motor 770 is coupled to the 3-phase filter output 25 via cables 30.

The diodes $D_A$ and $D_B$ are coupled to the DC link 105. The diodes $D_A$ and $D_B$ limit the output voltage of the passive dv/dt filter 25 and the filtering provided by the inductor $L_R$ and capacitors C reduce the dv/dt seen in the 3-phase filter output 25 (and at the AC motor 770).

While this passive dv/dt filter 150 may reduce the dv/dt, power is dissipated into the AC drive which may cause thermal overheating in the switches, which is caused by the size of the capacitors C and inductors $L_R$. Moreover, this passive dv/dt filter 150 would have a large footprint if the inductance was increased to lower the dv/dt, which in turn makes the housing for the power supply large. So tuning capacitors C is favorable from a size and cost standpoint.

SUMMARY

Accordingly, disclosed is a passive filter which comprises an inductor and a diode bridge. The inductor has a first end and a second end. The first end is coupleable to a phase output of an inverter. The diode bridge comprises a first diode and a second diode. The anode of the first diode is coupled to the second end of the inductor and a cathode of the first diode is coupleable to a positive DC bus voltage. The cathode of the second diode is coupled to the second end of the inductor and the anode of the second diode is coupleable to a negative DC bus voltage. The passive filter output is coupleable to a cable for an AC electric machine. A reverse recovery charge of the first diode and the second diode achieves a target DV/DT for an output voltage of the passive filter at operating temperatures.

In an aspect of the disclosure, a capacitance for the passive filter is only from the reverse recovery charge.

In an aspect of the disclosure, when the first diode and the second diode are ON, the first diode and the second diode clamp the passive filter output.

In an aspect of the disclosure, the target dv/dt is based on an industry standard. For example, the target dv/dt may be less than 1350V/µS, which is a dv/dt requirement of IEC 60034-17. In other aspects, the target dv/dt may be based on a peak output voltage of the filtered output.

In an aspect of the disclosure, the inverter has three-phases of output and the passive filter is coupleable to each phase, respectively.

Also disclosed is a passive dv/dt filter which comprises an inductor and a diode bridge. The inductor has a first end and a second end. The first end is coupleable to a phase output of an inverter. The diode bridge comprises a first diode and a second diode. The anode of the first diode is coupled to the second end of the inductor and a cathode of the first diode is coupleable to a positive DC bus voltage. The cathode of the second diode is coupled to the second end of the inductor and the anode of the second diode is coupleable to a negative DC bus voltage. The passive filter output is coupleable to a cable for an AC electric machine. The diodes have a reverse recovery charge. The reverse recovery charge provides the capacitance for the passive filter without a separate capacitor.

Also disclosed is a modular power supply for a plurality of accessory motors. The modular power supply comprises a DC bus link, a plurality of inverters and a plurality of passive filters. The DC bus link has a positive line and a negative line. Each inverter is capable of providing 3-phase AC power. Each passive filter comprises an inductor and a diode bridge. The inductor has a first end and a second end. The first end of the inductor is coupleable to a phase output. The diode bridge comprises a first diode and a second diode. The anode of the first diode is coupled to the second end of the inductor and the cathode of the first diode is coupleable to the positive line. The cathode of the second diode is coupled to the second end of the inductor and the anode of the second diode is coupleable to the negative line. A reverse recovery charge of the first diode and the second diode achieves a target DV/DT for an output voltage of the passive filter at operating temperatures.

Each of the plurality of inverters has one of the passive filters respectively coupled to each phase output. The filter output for each of the three phases of the respective inverter is respectively coupleable to an accessory motor via cables.

Also disclosed is a line replaceable unit (LRU). The LRU has an AC drive and a DC link input. The DC link input is configured to be coupled to DC power source. The AC drive is coupled to the DC link input. The AC drive comprises an inverter and three dv/dt filters, one per phase. The inverter is configured to convert the DC power source to 3-phase AC to supply AC power to a corresponding individual AC load via the three dv/dt filters. Each dv/dt filter comprises an inductor and a diode bridge. The inductor has a first end and a second end. The first end is coupleable to a phase of the 3-phase AC of the inverter. The diode bridge comprises a first diode and a second diode. The anode of the first diode is coupled to the second end of the inductor and the cathode of the first diode is coupleable to a positive line of the DC link input. The cathode of the second diode is coupled to the second end of the inductor and the anode of the second diode is coupleable to a negative line of the DC link input. A reverse recovery charge of the first diode and the second diode achieves a target DV/DT for an output voltage of the passive filter at operating temperatures. The filtered-3 phase AC is outputtable to the corresponding individual AC load.

DETAILED DESCRIPTION

Figure 3:
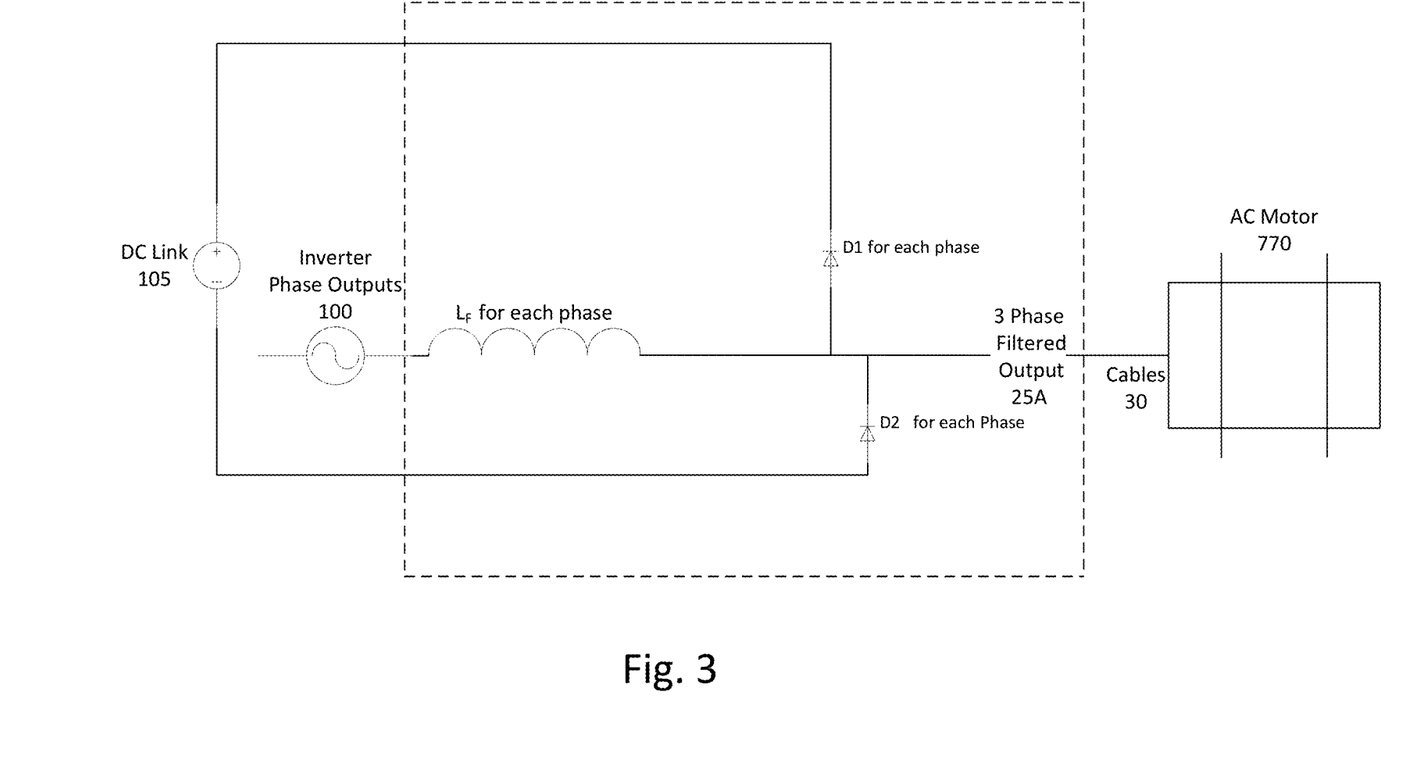
FIG. 3 illustrates a dv/dt filter for AC motors in accordance with aspects of the disclosure.

FIG. 3 illustrates a passive dv/dt filter 300 for filtering the output of an inverter for an AC motor 770 in accordance with aspects of the disclosure (such as a three-phase inverter). The passive dv/dt filter 300 comprises an inductor $L_F$ and a diode bridge D1 and D2. The diodes D1 and D2 serve two functions. One function is clamping. When the diodes D1 and D2 are ON, the respective diode clamps the output voltage of the passive dv/dt filter 300. When the diodes D1 and D2 switch from ON to OFF, their reverse recovery charge $Q_{rr}$ serves as capacitance for the passive dv/dt filter 300 and this capacitance in combination with the inductor $L_F$ limits the dv/dt of the output voltage (e.g., 3-phase filter output 25A) of the passive dv/dt filter 300. The use of a clamping diode in the passive dv/dt filter 300 is desirable because, when the peak voltage is limited, dv/dt standards allows for a faster rise time, e.g., higher dv/dt.

The reverse recovery charge $Q_{rr}$ is a function of the reverse recovery time $T_{rr}$ and maximum reverse recovery current $I_{RM}$. The larger the reverse recovery time $T_{rr}$ and/or the larger the reverse recover current $I_{RM}$, the higher the reverse recover charge is $Q_{rr}$.

Figure 4:
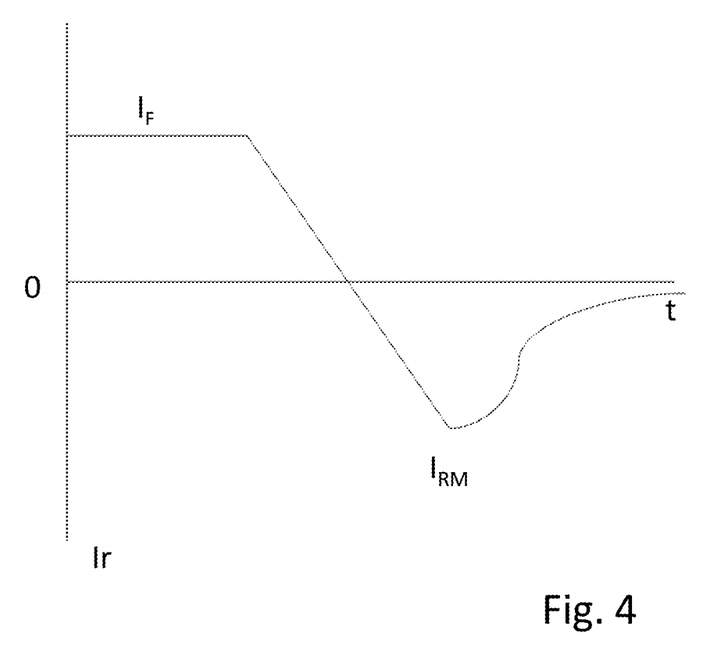
FIG. 4 illustrates the current verses time for a diode switching from ON to OFF.

FIG. 4 depicts an example curve for current over time when the diodes D1 and D2 are switched from ON to OFF. When ON, the forward current is $I_F$. When turned OFF, the current through the diode does not immediately stop, but rather reduces and eventually the current flows in the reverse direction until it reaches $I_{RM}$. Once it reaches $I_{RM}$, the current returns to steady state.

The inventors realized that this reverse recovery charge $Q_{rr}$ may be used instead of separate capacitors C to limit dv/dt and provide the capacitance for the passive dv/dt filter 300. Therefore, by eliminating the separate capacitors C, the size of the passive dv/dt filter 300 is smaller. Additionally, by eliminating the separate capacitors C, the cost of the passive dv/dt filter 300 is lower. Further, by eliminating the separate capacitors C, losses in the passive dv/dt filter 300 are reduced.

Charge is related to capacitance by voltage based on the following equation:

$$Q=CV \quad (1)$$

Putting reverse recovery charge $Q_{rr}$ in for Q and solving for C, the equivalent capacitance from the reverse recovery charge $Q_{rr}$ is determined from the following equation:

$$C = \frac{Qrr}{V}, \text{ where } V \text{ is the DC link voltage} \quad (2)$$

which is also the maximum output of the inverter.

In accordance with aspects of the disclosure, the passive dv/dt filter 300 may achieve a target dv/dt. The target dv/dt is the maximum change in voltage over time for the filter output. In a case where the inverter supplies 3-phase output, each of the phases of the 3-phase filter output 25A will have a dv/dt less than or equal to the target dv/dt. The target dv/dt may be based on an application, such as the type of AC motor driven. In other aspects of the disclosure, the target dv/dt may be based on an industry standard. For example, IEC 60034-17 has a required dv/dt of 1.36 kV for 1 μs (1.36 GV for 1 second). However, other industry standards may have different dv/dt requirements (targets).

To achieve a target dv/dt, a resonant frequency is set. The resonant frequency accounts for leakage inductance in the AC motor. The resonant frequency is determined from the following equation:

$$\omega_{res} = \frac{1}{\sqrt{L_t * C}} \quad (3)$$

$$\text{where } L_t = \frac{L_F * L_m}{L_F + L_m}, \text{ and where } L_m \text{ is the AC motor leakage.} \quad (4)$$

Looking in terms of a per-unit, dv/dt is determined by the following equation:

$$\frac{dv}{dt} = 2\pi * V_{inv} * \omega_{res} \quad (5)$$

$V_{inv}$ is the inverter input voltage (source). All values are per unit.

The inductor $L_F$, per unit, is determined from the following equation:

$$L_F = \frac{2\pi * V_{inv}^2}{i_D * \frac{dv}{dt}} \quad (6)$$

All values are per unit. $I_D$ is the current through the diodes D1 and D2 when in reverse recovery.

The capacitance, per unit, is determined from the following equation:

$$C = \frac{1}{L_F * \omega_{res}^2} \quad (7)$$

All values are per unit. The current within the passive dv/dt filter 300, per unit, is determined from the following equation:

$$i_{res} = V_{inv} * \sqrt{\frac{C}{L_F}} \quad (8)$$

All values are per unit.

$Q_{rr}$ (per unit) can be inserted into equation 7, to relate the reverse recovery charge, the inductance $L_F$ and resonant frequency. The capacitance (and in turn $Q_{rr}$) and inductance $L_F$ are selected to balance loss (increase in $i_{res}$) and inductor L. A large inductor $L_F$ will lower the loss but increase the size of the passive dv/dt filter 300. At the same time, a large capacitance increases the reverse recovery charge $Q_{rr}$.

The reverse recovery charge $Q_{rr}$ of a diode is dependent on temperature. The reverse recovery charge $Q_{rr}$ is typically lower at room temperature than at a higher temperature. Thus, in accordance with aspects, of the disclosure, a diode D1 and D2, having a reverse recovery charge $Q_{rr}$ satisfying the target dv/dt, at all expected operating temperatures in used. For example, diodes in a power system being initially turned ON, will experience an operating temperature around room temperature, but when the system is running for a time, the operating temperature increases.

In accordance with aspects of the disclosure, the diodes D1 and D2 for the passive dv/dt filter 300 may be commercial off the shelf diodes, such as ISL9R18120G2 and ISL9R18120S3s available from On Semiconductor®. These diodes D1 and D2 have a reverse recovery charge $Q_{rr}$ of 950 nC at 25° C. and a $Q_{rr}$ of 2.0 μC at 125° C. These diodes have a soft recovery under typical operating conditions. While these diodes may have a soft recovery, the reverse recovery time is only a fraction of the expected pulse width modulation switching of switches in the inverter. For example, the reverse recovery time may be nanoseconds, whereas the PWM rate is in milliseconds.

While diodes ISL9R18120G2 and ISL9R18120S3s available from On Semiconductor® have been described herein, by way of example, the diodes D1 and D2 are not limited to the example, and other diodes may be used. For example, different diodes may be used where the input voltage is lower and, thus the requirement for a reverse recovery charge is lower.

As depicted in FIG. 3, the cathode of diode D1 is coupled to a positive line of the DC link 105 (also referred to herein as $V_{inv}$). The anode of diode D1 is coupled to an end of the inductor $L_F$, an output of the passive dv/dt filter (25A) and the cathode of diode D2. The anode of diode D2 is coupled to a negative line of the DC link 105 (also referred to herein as $V_{inv}$). The cathode of D2 is coupled to the same end of the inductor $L_F$, the output of the passive dv/dt filter (25A) and the anode of diode D1. The other end of the inductor $L_F$ is coupled to a phase output of the inverter (referenced in FIG. 3 as Inverter Phase Output 100).

In accordance with aspects of the disclosure, the inverter provides three-phase AC output and the disclosed passive dv/dt filter 300 is respectively coupled to a phase.

The inverter has three-sets of switches, one set for each phase. Each set comprises two switches (one of the switches is referred to herein as a top switch and the other is referred to herein as bottom switch). The top switch and the bottom switch, in each set, are operated complementarily, where when one switch is ON, the other switch is OFF.

When the top switch is ON, the diode D1 is ON, e.g., current $I_F$ flows across the diode, and diode D2 is OFF (if diode D2 was ON immediately before being OFF), diode D2 exhibits a reverse recovery charge $Q_{om}$. At this time, diode D1 clamps the output voltage, e.g., voltage limit. Diode D2 is providing capacitance for the passive dv/dt filter 300 and reducing the dv/dt (in combination with the inductor $L_F$) in the filter output 25A.

When the top switch switches from ON to OFF, the diode D1 subsequently turns OFF. At this time, the current follows the current time curve as shown in FIG. 4 and diode D1 exhibits a reverse recovery charge $Q_{rr}$. Diode D1 is providing capacitance for the passive dv/dt filter 300 and reducing the dv/dt (in combination with the inductor $L_F$) in the filter output.

When the bottom switch switches from OFF to ON, the diode D2 subsequently turns ON. At this time, diode D2 clamps the output voltage, e.g., voltage limit.

In some aspects of the disclosure, the passive dv/dt filter 300 may be incorporated into a modular accessory power system ("MAPS").

The MAPS may be installed in a vehicle. The vehicle may be an electric or hybrid electric vehicle. The term vehicle used herein means a car, bus, taxi, vessel, airplane, UAV, UUV, train, tank, truck, or helicopter. The hybrid electric vehicle may be in a series hybrid configuration or a parallel hybrid configuration.

In some aspects of the disclosure, an electric drive propulsion of an electric or hybrid electric vehicle may include an engine, a generator, a controller, an electric motor and an energy storage system. The MAPS may be incorporated into the electric drive propulsion. For example, the MAPS may be able to receive power from the energy storage system and or genset (engine/generator). The genset and/or energy storage system may supply power to the DC link.

In other aspects, the power may be supplied from the engine via a power take off shaft (PTO) and another generator such that the MAPS is separate from the drivetrain.

In other aspects of the disclosure, the MAPS may be separate standalone system and receive power from another energy storage system. In this embodiment, the another energy storage system supplies power to the DC link.

In an aspect of the disclosure, the DC link may be high voltage. High voltage used herein means a voltage at or above 50 VDC. In other aspects, the DC link may be a low voltage. For example, the low voltage DC link may be 24 VDC.

In an aspect of the disclosure, the MAPS may supply power to a plurality of AC motors $770_{1-N}$. In some aspects, the MAPS may also include independent DC drives (not shown in FIG. 7) for providing power to each DC load.

In some aspects, the independent AC drives $750_{1-N}$ may be housed within a line replaceable unit (LRU). The LRUs may be stacked a within the housing to conserve space. The DC drives may also be stacked.

Figure 7:
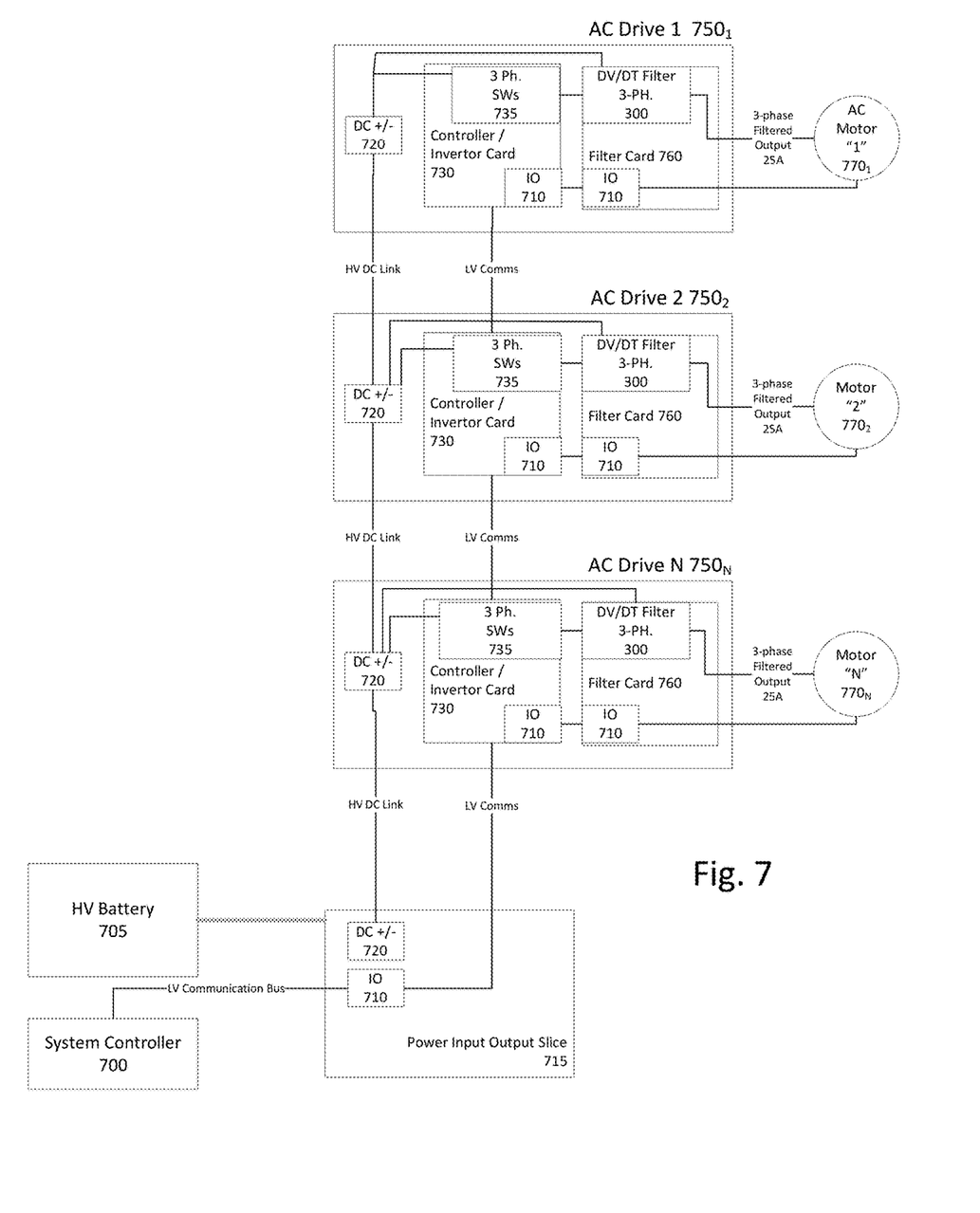
FIG. 7 illustrates a diagram of a modular accessory power system for a plurality of AC motors in accordance with aspects of the disclosure.

FIG. 7 illustrates an example of the MAPS having the passive dv/dt filter 300. As depicted, the DC link is high voltage. In this example, a single DC link input is used. In FIG. 7, the DC link between various components is shown with a single line to simplify the drawings, however, the DC link will include a positive line and a negative line. The certain components of the MAPS are installable in a chassis (housing). The chassis includes slots for installation of the modular components (LRUs) such as the AC drive 750, the DC drive and PIO slice 715 described herein. The chassis may accommodate different configurations and numbers of AC drive 750 and DC drive.

As depicted, power is supplied by a HV battery 705. However, as noted above, in other aspects, the power may be supplied in other manners. Power is relayed to each individual AC drive 750$_{1-N}$ via a power input output slice (PIO slice) 715.

The PIO slice 715 has an I/O interface 715, e.g., a low voltage communication interface. In some aspects, the I/O interface is a controller area network (CAN) interface. The PIO slice 715 daisy chains a communication bus to the individual AC drives 750$_{1-N}$ and serves to relay system level communication to the AC drives 750$_{1-N}$, e.g., connects low voltage communication bus from the system controller 700 to the AC drives 750$_{1-N}$. Since a dv/dt is not needed in a DC drive, the DC drives have been omitted from FIG. 7. Since each component includes a I.O, the feedback from the AC motors 770$_{1-N}$, such as position and speed may be relayed to the system controller 100.

Each individual AC drive 750 comprises a voltage input terminal (shown in FIG. 7 as DC+− 720), a controller/inverter card 730 and a filter card 760. In some aspects of the disclosure, the filter card 760 comprises the dv/dt filter 300, per phase, as disclosed herein. In other aspects, the filter card 760 may also include an EMI filter. In other aspects, the filter card 760 may also include both an EMI filter and a common mode current transformer. In this aspect, the output of the dv/dt filter 300 may be coupled to the common mode current transformer and the EMI filter, and then to an AC drive output terminal.

The controller/inverter card 730 comprises a pulse width modular controller (PWM) controller and a three-phase inverter. The PWM controller drives the switches 735 in the inverter. In an aspect of the disclosure, the switches 735 are MOSFET and the PWM controller provides a control signal to the gate.

The system controller 700 may comprise a processor and memory. The processor may control the PWM controller via the low voltage communication signal bus and the I/O 710 in each controller/inverter card 730. For example, the processor may implement a voltage/current regulation. The processor may also set a target speed which is a desired AC motor speed. In some aspects, the system controller 700 may also communicate with other systems in the vehicle in the I/O 710 and control the AC drives 750$_{1-N}$ based on information received from the other systems. For example, the system controller 700 may receive a turn on signal for air condition compressor and in response to the receipt of the turn on signal, the system controller 700 may issue an command or instruction to the corresponding AC drive 750 to turn the motor for the air condition compressor ON, via the low voltage communication bus and I/O 710. Similarly, the system controller 700 may receive a signal to increase or decrease the temperature (speed of the motor) and in response to the receipt, issue a command or instruction to the corresponding AC drive 750 for the same.

In some aspects, the processor may be a microcontroller or microprocessor or any other processing hardware such as a CPU, GPU, Field programmable gate array (FPGA) or Programmable logic device (PLD).

In some aspects, the memory may be separate from the processor or integrated in the same. For example, the microcontroller or microprocessor includes at least one data storage device, such as, but not limited to, RAM, ROM and persistent storage. In an aspect of the disclosure, the processor may be configured to execute one or more programs stored in a computer readable storage device. The computer readable storage device can be RAM, persistent storage or removable storage. A storage device is any piece of hardware that is capable of storing information, such as, for example without limitation, data, programs, instructions, program code, and/or other suitable information, either on a temporary basis and/or a permanent basis.

The AC drives 750$_{1-N}$ also comprise output terminals for the 3-phase Filtered Output power 25A. One or more cables 30 may be inserted into the output terminals. These cables 30 are connectable to an AC load, e.g., AC motor 770$_{1-N}$.

In an aspect of the disclosure, the MAPS may provide accessory power input of 230 VAC at 28 A rms per drive. For example, an AC load may comprise air compressors, cooling fans, air condition compressors and power steering pumps. Other examples, of the AC load may be AC motors for industrial machinery. However, the AC load is not limited to the examples provided herein. The phrase "AC load" used herein also refers to the sub-systems required for the accessory to function including the motors therefor.

In other aspects, the MAPS may provide 28 VDC at 200 A per drive. The DC load may comprise lighting, radio, fare box, power windows, doors, fans and power steering. The DC load are not limited to the examples provided herein.

The passive dv/dt filter 300 in accordance with aspects of the disclosure was tested and results compared with a dv/dt filter have the LC filter configuration as shown in FIG. 1. Waveforms of the filtered and unfiltered output were monitored using an oscilloscope and the dv/dt was calculated using the oscilloscope. The testing used a DC link of 800 VDC. MOSFETs were used as the switches for the inverter. The switching frequency was 20 KHz. The inverter and/or filters were connected to a 20 hp AC motor via 50 ft cables.

Figure 5:
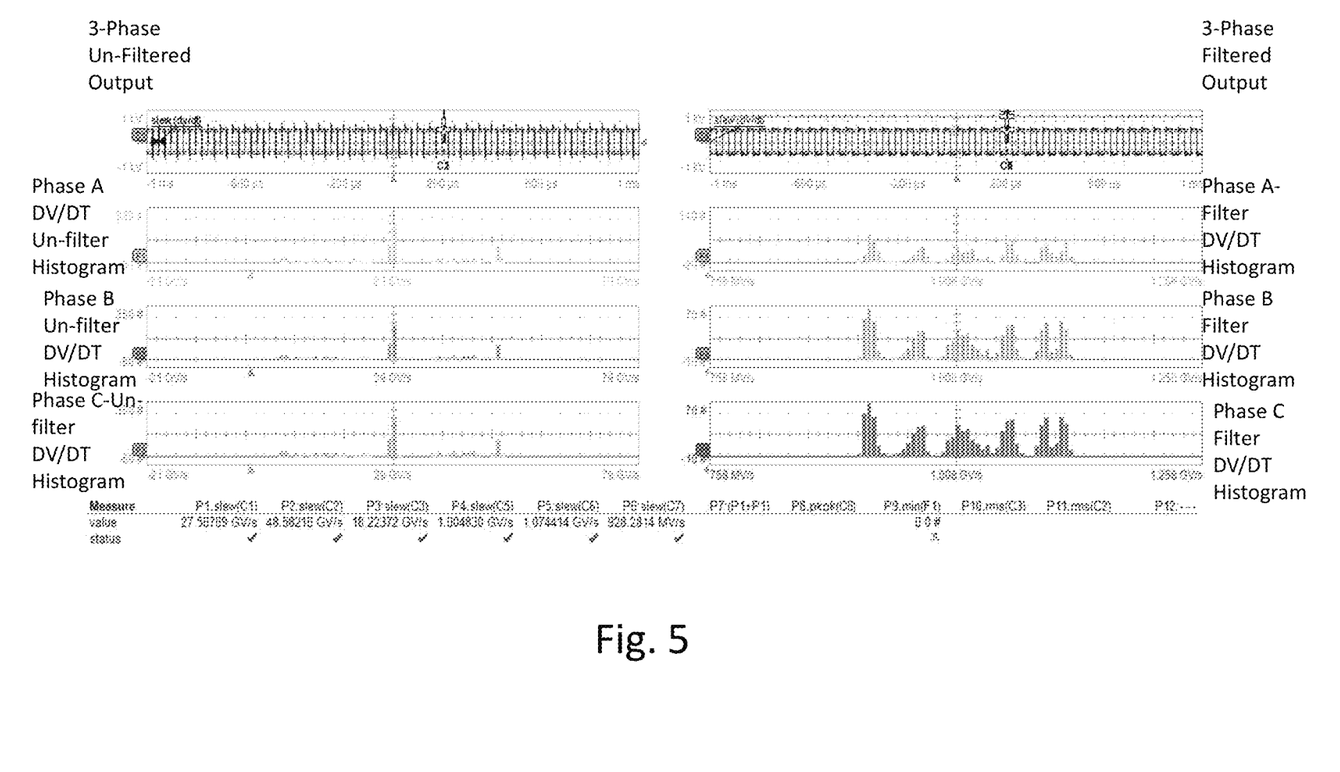
FIG. 5 illustrates a screenshot from an oscilloscope displaying 3-phase output and dv/dt at the inverter output without a dv/dt filter and the 3-phase output and dv/dt, at the output of the dv/dt filter, in accordance with aspects of the disclosure.

FIG. 5 illustrates the 3-phase output of the inverter 100 without a passive dv/dt filter on the left side on the top over a measured time. The output was measured at the output of the switches for the respective phase. FIG. 5 also illustrates three histograms for the dv/dt, one for each phase of the inverter without the passive dv/dt filter (Phase A dv/dt Un-filtered Histogram, Phase B dv/dt Un-filtered Histogram, and Phase C dv/dt Un-filtered Histogram). The x-axis is the dv/dt and the y-axis is the number of occurrence(s) in the observed time.

As can be seen from the histograms in the left side of FIG. 5, unfiltered phase outputs from the invertor had median dv/dt values of approximately 29 GV/s with maximum values of approximately 51 GV/s for all three phases. The dv/dt (Slew rate) likely would cause damage to an AC motor 770 (including insulation) and exceeds a required dv/dt for different industry standards.

One measured the dv/dt (slew rates) is shown on the bottom of the figure, P1, P2 ad P3 (at a given period of time). The difference in dv/dt seen at this instant may be based on which switches are being actuated at this time.

On the right side of FIG. 5, the 3-phase filtered output 25A using the passive dv/dt filter 300 in accordance with aspects of the disclosure is shown on the top over a measured time. The output was measured at the output terminal of the AC drive. Three dv/dt histograms are also illustrated one for each phase of the inverter with the passive dv/dt filter (Phase A dv/dt Filtered Histogram, Phase B dv/dt Filtered Histogram, and Phase C dv/dt Filtered Histogram). The same DC linked was used, e.g., 800 VDC and switching frequency. Inductor $L_F$ was 30 µH. ISL9R18120G2 diodes available from On Semiconductor® were used as D1 and D2 in the diode bridge. No separate capacitors were included.

As can be seen from the histograms in FIG. 5 (right side), the filtered phase outputs from the filter had median dv/dt values of approximately 1 GV/s with maximum values of approximately 1.1 GV/s for all three phases.

One measured the dv/dt (slew rates) is shown on the bottom of the figure, P1, P2 ad P3 (at a given period of time). The difference in dv/dt seen at this instant may be based on which switches are being actuated at this time.

The filtered dv/dt for each phase is less than 1.36 GV per second, which is the required dv/dt for IEC 60034-17. A comparison of the dv/dt in FIG. 5 un-filtered v. filtered, shows that the passive dv/dt filter 300 described herein significantly reduces the dv/dt to below industry standards.

Figure 6:
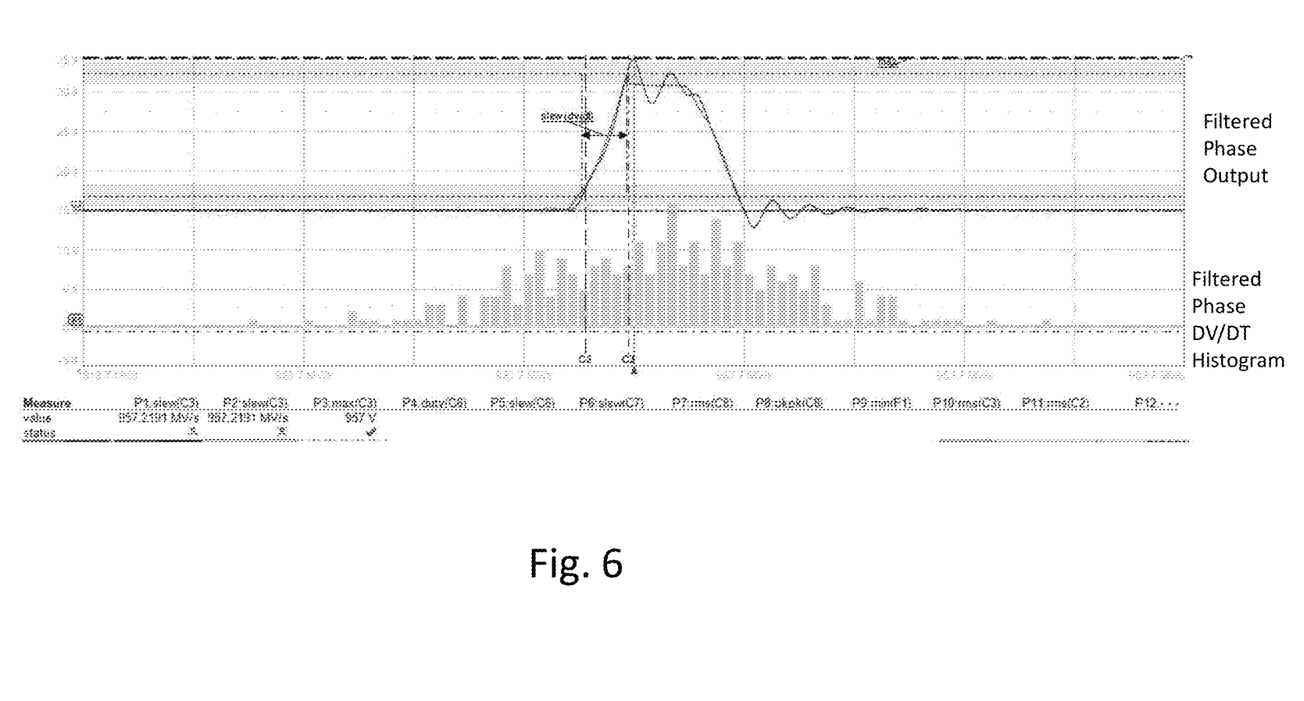
FIG. 6 illustrates a screenshot from an oscilloscope displaying a filtered phase output and dv/dt, at the output of the dv/dt filter, in accordance with aspects of the disclosure.

FIG. 6 shows the effect at the terminals of the AC motor. FIG. 6 shows a single phase on top and also shows a dv/dt histogram for the filtered phase output of the passive dv/dt filter 300 in accordance with aspects of the disclosure (bottom). The filtered phase output was measured at the terminals of the AC motor. As seen in the histogram in FIG. 6, the filtered phase output of the passive dv/dt filter has a maximum dv/dt value of approximately 957 MV (also shown in P1 on the bottom). One measured the dv/dt (slew rates) is shown on the bottom of the figure, P1 (at a given period of time). The maximum voltage seen at the terminals of the AC motor is 957V (as shown in FIG. 6, P3 max (C3).

Figure 2:
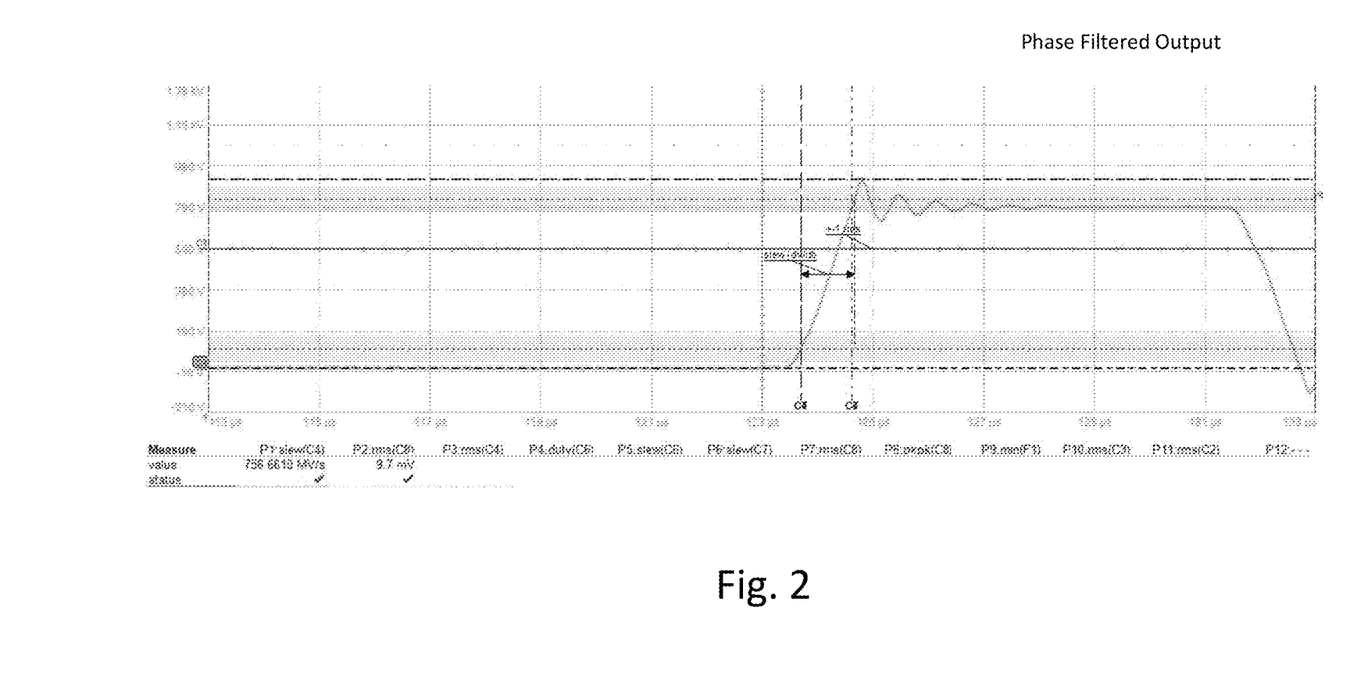
FIG. 2 illustrates a screenshot from an oscilloscope displaying a filtered phase output and dv/dt where a LC dv/dt filter having the configuration as shown in FIG. 1 was used to filter a phase output of an inverter.

FIG. 2 illustrates a filtered output for a single phase using the topology of the LC dv/dt filter as described in FIG. 1 for 20 µs. The output was measured at the terminals of the AC motor. The same DC link was used, e.g., 800 VDC and switching frequency. For comparison purposes, the same inductor and diodes were used. Capacitors C were included in the passive dv/dt filter 150 having a value of 3.3 nf.

As can be seen in FIG. 2, the dv/dt (Slew rate) is approximately 756 MV for one of the phases. Although FIG. 2 shows 9V below P2 max, this value is a measurement on a floating signal and was not turned OFF. However, this value is not relevant to the dv/dt or maximum voltage. A comparison of the results illustrated in FIG. 2 and FIG. 6, show that both are capable of achieving a dv/dt which is less than industry standard. However, as described above, since the passive dv/dt filter 150 includes separate capacitors, the loss is higher and may overheat the switches on the inverter due to the circulating currents.

As used herein, the term "processor" may include a single core processor, a multi-core processor, multiple processors located in a single device, or multiple processors in wired or wireless communication with each other and distributed over a network of devices, the Internet, or the cloud. Accordingly, as used herein, functions, features or instructions performed or configured to be performed by a "processor", may include the performance of the functions, features or instructions by a single core processor, may include performance of the functions, features or instructions collectively or collaboratively by multiple cores of a multi-core processor, or may include performance of the functions, features or instructions collectively or collaboratively by multiple processors, where each processor or core is not required to perform every function, feature or instruction individually.

Various aspects of the present disclosure may be embodied as a program, software, or computer instructions embodied or stored in a computer or machine usable or readable medium, or a group of media which causes the computer or machine to perform the steps of the method when executed on the computer, processor, and/or machine. A program storage device readable by a machine, e.g., a computer readable medium, tangibly embodying a program of instructions executable by the machine to perform various functionalities and methods described in the present disclosure is also provided, e.g., a computer program product.

The computer readable medium could be a computer readable storage device or a computer readable signal medium. A computer readable storage device, may be, for example, a magnetic, optical, electronic, electromagnetic, infrared, or semiconductor system, apparatus, or device, or any suitable combination of the foregoing; however, the computer readable storage device is not limited to these examples except a computer readable storage device excludes computer readable signal medium. Additional examples of the computer readable storage device can include: a portable computer diskette, a hard disk, a magnetic storage device, a portable compact disc read-only memory (CD-ROM), a random access memory (RAM), a read-only memory (ROM), an erasable programmable read-only memory (EPROM or Flash memory), an optical storage device, or any appropriate combination of the foregoing; however, the computer readable storage device is also not limited to these examples. Any tangible medium that can contain, or store, a program for use by or in connection with an instruction execution system, apparatus, or device could be a computer readable storage device.

A computer readable signal medium may include a propagated data signal with computer readable program code embodied therein, such as, but not limited to, in baseband or as part of a carrier wave. A propagated signal may take any of a plurality of forms, including, but not limited to, electromagnetic, optical, or any suitable combination thereof. A computer readable signal medium may be any computer readable medium (exclusive of computer readable storage device) that can communicate, propagate, or transport a program for use by or in connection with a system, apparatus, or device. Program code embodied on a computer readable signal medium may be transmitted using any appropriate medium, including but not limited to wireless, wired, optical fiber cable, RF, etc., or any suitable combination of the foregoing.

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A passive filter comprising:
   an inductor having a first end and a second end, the first end coupleable to a phase output of an inverter; and
   a diode bridge comprising a first diode and a second diode, where an anode of the first diode is coupled to the second end of the inductor and a cathode of the first diode is coupleable to a positive DC bus voltage, and where a cathode of the second diode is coupled to the second end of the inductor and an anode of the second diode is coupleable to a negative DC bus voltage,
   wherein a passive filter output is coupleable to a cable for an AC electric machine,
   wherein a reverse recovery charge of the first diode and the second diode achieves a target DV/DT for an output voltage of the passive filter at operating temperatures; and
   wherein a capacitance for the passive filter is only from the reverse recovery charge.

2. The passive filter of claim 1, wherein when the first diode and the second diode are ON, the first diode and the second diode clamp the passive filter output.

3. The passive filter of claim 1, wherein the reverse recovery charge of the first diode and the second diode is at least 950 nC at 25° C.

4. The passive filter of claim 1, wherein the inverter has three-phases of output and wherein the passive filter is coupleable to each phase, respectively.

5. The passive filter of claim 1, wherein a reverse recovery time of the first diode and the second diode is less than a pulse width modulation (PWM) rate of the inverter.

6. The passive filter of claim 1, wherein the target dv/dt is less than 1350V/μs.

7. The passive filter of claim 1, wherein the target dv/dt is based on a peak output voltage.

8. The passive filter of claim 1, wherein the target dv/dt is based on an industry standard.

9. A passive dv/dt filter comprising:
- an inductor having a first end and a second end, the first end coupleable to a phase output of an inverter; and
- a diode bridge comprising a first diode and a second diode, where an anode of the first diode is coupled to the second end of the inductor and a cathode of the first diode is coupleable to a positive DC bus voltage, and where a cathode of the second diode is coupled to the second end of the inductor and an anode of the second diode is coupleable to a negative DC bus voltage,
    wherein a passive filter output is coupleable to a cable for an AC electric machine, and
    wherein the first diode and the second diode have a reverse recovery charge, the reverse recovery charge provides the capacitance for the passive filter without a separate capacitor.

\* \* \* \* \*